United States Patent [19]
Kinney et al.

[11] Patent Number: 5,179,038
[45] Date of Patent: Jan. 12, 1993

[54] HIGH DENSITY TRENCH ISOLATION FOR MOS CIRCUITS

[75] Inventors: Wayne I. Kinney; John P. Niemi; Jonathan E. Macro, all of Albuquerque, N. Mex.; David Back, Son, Netherlands

[73] Assignee: North American Philips Corp., Signetics Division, Sunnyvale, Calif.

[21] Appl. No.: 456,029

[22] Filed: Dec. 22, 1989

[51] Int. Cl.$^5$ ............... H01L 21/76; H01L 21/306
[52] U.S. Cl. .................................. 437/78; 437/34; 437/79
[58] Field of Search ............ 437/67, 52, 228, 78, 437/79, 34, 56, 57

[56] References Cited

U.S. PATENT DOCUMENTS

| | | |
|---|---|---|
| 4,196,440 | 4/1980 | Anantha et al. |
| 4,369,565 | 1/1983 | Muramatsu |
| 4,520,552 | 6/1985 | Arnould et al. ........... 156/643 |

FOREIGN PATENT DOCUMENTS

| | | | |
|---|---|---|---|
| 0057126 | 8/1982 | European Pat. Off. | |
| 0072966 | 2/1983 | European Pat. Off. | |
| 0073370 | 9/1983 | European Pat. Off. | |
| 0172772 | 2/1986 | European Pat. Off. | 437/67 |
| 0038238 | 10/1981 | France | |
| 0061855 | 6/1982 | Japan | |
| 58-116749 | 7/1983 | Japan | |
| 58-200553 | 11/1983 | Japan | |
| 0170250 | 9/1985 | Japan | 437/67 |
| 0170251 | 9/1985 | Japan | 437/67 |
| 0204442 | 8/1989 | Japan | 437/67 |

OTHER PUBLICATIONS

"Characterization & Modeling Of The Trench Surface Inversion Problem For The Trench Isolated CMOS Technology"; Cham, Chiang, Wenocur, Rung; IEEE 1983 pp. 23-26.

"Deep Trench Isolation For Bipolar Processes"; Malaviya; IBM Techn. Disc. Bulletin vol. 24 No. 11A Apr. 1982; pp. 5578-5580.

"Submicron MOS VLSI Process Technologies"; Arai; IEEE 1983; pp. 19-22.

"A Submicron CMOS Megabit Level Dynamic RAM Technology Using Doped Face Trench Capacitor Cell"; Minegishi, Nakajima, Miura, Harada & Shibata; IEEE 1983 pp. 319-322.

"Depletion Trench Capacitor Technology For Megabit Level MOS dRAM"; Morie, Minegishi & Nakajima; IEEE 1983; pp. 411-414.

"High Speed Latchup-Free 0.5pm Channel CMOS Using Self-Aligned TiSi2 & Deep-Trench Isolation Technologies"; Yamaguchi, Morimoto, Kawamoto, Par, Eiden; IEEE 1983; pp. 522-525.

"Dielectrically Isolated Transistor Structure With Sidewall Inversion Prevention"; Berger & Thiel; IBM Tech. Discl. Bulletin vol. 21 No. 7 Dec. 1978; pp. 2868-2869.

*Primary Examiner*—Olik Chaudhuri
*Assistant Examiner*—Ourmazd S. Ojan
*Attorney, Agent, or Firm*—Leroy Eason; Ron Meetin

[57] ABSTRACT

A method of forming isolation trenches in CMOS integrated circuits is disclosed. The trench side walls are covered by a thin oxide layer, and the trenches are filled with a highly doped polysilicon. The doped polysilicon has a high work function which prevents oxide charges from inverting the trench side walls and thereby turns off the parasitic transistors at these side walls to reduce latchup.

4 Claims, 3 Drawing Sheets

HIGH DENSITY TRENCH ISOLATION FOR MOS CIRCUITS

BACKGROUND OF THE INVENTION

The present invention relates, in general, to a method of providing isolation for MOS circuits, and more particularly, to a method of providing deep isolation trenches having oxidized side walls and filled with heavily doped polysilicon wherein the work function of the doped polysilicon prevents inversion of the charges on the trench side wall and the consequent formation of parasitic transistors.

In monolithic integrated circuit technology, it is usually necessary to isolate various active and passive elements from one another in the integrated circuit structure. A variety of techniques are known for providing such isolation, with one form involving the formation of grooves or depressions in silicon around the regions to be isolated. During the groove formation, the remainder of the silicon surface is covered by a protective film which is substantially unaffected by the etching process used to form the grooves. Thereafter, the silicon in the groove area is oxidized with the resulting silicon dioxide filling the groove as well as oxidizing further into the silicon. However, one of the major problems with this process is the formation of what is known as "birds beak", which is a non-planar silicon dioxide formation at the top periphery of the groove, caused by lateral oxidation underneath the protective film provided during the etching process. The consequence of this lateral oxidation is a general stress in the perimeter region of the groove as well as difficulties in achieving good diffusions abutting the vertical portion of the silicon dioxide, thereby defeating to some extent a major benefit of the original purpose of the silicon dioxide region. Although attempts have been made in the past to overcome the problems with this process, they have not been totally successful.

There has recently been a revival of interest in developing new integrated circuit isolation techniques because of the intensifying need to scale integrated circuits to smaller dimensions and the difficulty which has been encountered in similarly reducing the dimensions of the isolating devices formed by prior techniques. In particular, CMOS (complementary metal oxide semiconductor) technology has been difficult to scale because it is particularly susceptible to latchup, wherein adjacent transistors in an integrated circuit produce a large current flow which can cause permanent damage to CMOS circuits. Because of this susceptibility, due to poor isolation between adjacent elements, CMOS technology generally requires large p-channel to n-channel spacing.

Trench isolation has been proposed as a replacement for isolation by local oxidation in CMOS devices. One advantage of trench techniques is that they do not generate a "birds beak", and can thus produce isolation regions whose minimum dimensions are determined only by the lithographic feature size. Another advantage is that trenches might not require additional doping to control threshold voltages of parasitic devices. A key problem which has thus far prevented effective implementation of trench isolation in CMOS circuits, however, is the existence of oxide charges on the trench side walls. Such charges are inevitable in any oxidation, and trench side walls are particularly susceptible because of poor surface quality after the trench etching step and because they are usually [110] crystalline surfaces. The oxide charge is sufficient to invert typical P-type silicon in which the trench is formed, thereby electrically connecting separate n-type devices in the integrated circuit. The oxide charge has been measured to be $2E11/CM^2$ and it was found that to achieve device isolation in such a situation, it was necessary to keep n-type source/drain regions in the integrated circuit at least 1.5 microns away from the trenches. Such a large spacing is impractical for high density circuits.

Trenches have been used in integrated circuits for a variety of purposes, including increasing storage node capacitance in DRAMs (dynamic random access memory), but such trenches are not used for isolation. DRAM trenches have been filled with a conductive material which is contacted electrically at the top. This contact provides control over the potential of the conductor in the trench so that the conductor can serve as a capacitor plate. In this arrangement, a voltage can be applied to keep the trench side wall at a potential which prevents conduction from adjacent devices. However, the necessity of providing contacts at the top of the trenches makes circuit layout very difficult and substantially lowers the circuit packing density.

Trench structures have been proposed for providing contact with the substrate on which the integrated circuit is formed in bipolar and MOS circuits. Such structures have consisted of a trench in the center of an oxide isolation layer which was grown either before or after formation of the trench. The trench was filled with a conducting material such as doped polysilicon and contact was made between the conductor and the substrate by removal, as by reactive ion etching, of the oxide on the trench bottom prior to deposition of the conductor material in the trench. However, such a structure is not directly useful for high density isolation, since it uses local oxidation on the trench walls for the primary isolation.

Attempts have been made to dope the side walls of trenches to provide isolation, but such doping is extremely difficult and the use of typical diffusion sources for this purpose is, therefore, unlikely to give sufficient control over parasitic side wall threshold to permit the use of doping as a technique for device isolation.

SUMMARY OF THE INVENTION

The present invention is directed to a deep trench isolating structure for providing high density in CMOS structures, and to the method of producing such structures. According to the invention, a trench is provided in an n-type silicon substrate. A thin layer of oxide is formed on the trench side wall, and the trench is filled with an electrically conductive, highly doped polysilicon material which makes electrical contact with the underlying silicon only at the bottom of the trench. The polysilicon conductor also contacts the thin layer of oxide on the side walls of the trench. The difference in the work function of the polysilicon and that of the substrate results in a flow of charges at the interface between the two materials which produces a net charge differential which may be on the order of $2 \times 10^{12}$. This effectively neutralizes the oxide charge formed in the trench, and prevents the formation of parasitic transistors and unwanted conductive channels in the trench side walls. As a result, it becomes possible to place source/drain regions in the silicon substrate directly against the trench side wall. Accordingly, CMOS circuitry of high density is achievable, and undesirable latch up is avoided.

In accordance with the method of the present invention, high density isolation trenches for CMOS circuits are obtained by a process which includes initially oxidizing the surface of an n-type silicon substrate, coating the oxide with a nitride layer, and then applying a CVD (chemical vapor deposition) oxide layer. Thereafter, the location and width of the desired trenches are defined, as by conventional lithographic techniques, and a trench is etched in the oxide layers and the underlying substrate, as by reactive ion etching. The resist material used to define the trenches is then stripped and a thin oxide layer is grown in the trench. Resistive ion etching is then used to remove the oxide from the trench bottom, leaving the side wall oxide intact. An n+ polysilicon material is then deposited in the trench, is planarized, and the CVD oxide layer is stripped from the surface of the substrate.

For CMOS technology, the foregoing trench may be used for isolating either n-channel, p-channel, or both types of devices. For convenience, the following description refers to a preferred method for forming isolation trenches for a dual-channel, or dual-well, CMOS circuit on an n-type substrate, but the method may also be used with wells on p-type substrates. In accordance with this method, after the CVD oxide is stripped from the surface of the substrate, the first n-well, which in this case is an n-well, is defined by conventional photolithographic techniques utilizing a resist material on the surface of the substrate. After definition of the location, shape, and dimension of the n-well, the nitride layer is etched from the n-well location, and the n-well is implanted. The resist material is then stripped, and the device is annealed to oxidize the n-well and the polysilicon surface as well as to drive the implant dopants into the substrate to form the n-well region in the substrate. In similar manner, a second well, in this case a p-well is implanted on the side of the trench opposite to that of the n-well region and the substrate is again annealed to drive the dopant into the p-well region. Thereafter, a second trench is defined in the p-well, immediately or at least closely adjacent to the location of the existing n+ polysilicon trench, the nitride and oxide layers on the surface of the substrate in the area of the trench are etched away and the trench is then etched to a depth shallower than the depth of the p-well. The trench is oxidized, the oxide is removed from the bottom wall of the trench, and a p+ type polysilicon is then deposited in the second trench. The polysilicon is planarized, and the nitride and oxide layers are stripped from the surface of the device. A gate oxide is then grown on the surface of the device at low temperatures to achieve preferential oxidation rates on the heavily doped polysilicon layers to thereby complete the formation of the isolating trenches. The device may then be further processed in the normal manner for CMOS technology.

The p+ and n+ type polysilicon materials in the corresponding trenches provide isolation for the corresponding n-well and p-well segments in the substrate, and since the work function of the polysilicon is used to provide the desired isolation, these trenches can be relatively narrow and close together to provide a high density CMOS structure.

BRIEF DESCRIPTION OF THE DRAWINGS

The foregoing and additional objects, features and advantages of the present invention will be apparent to those of skill in the art from a consideration of the following detailed description of a preferred embodiment, taken in conjunction with the accompanying drawings in which.

DESCRIPTION OF PREFERRED EMBODIMENT

Figure 1:
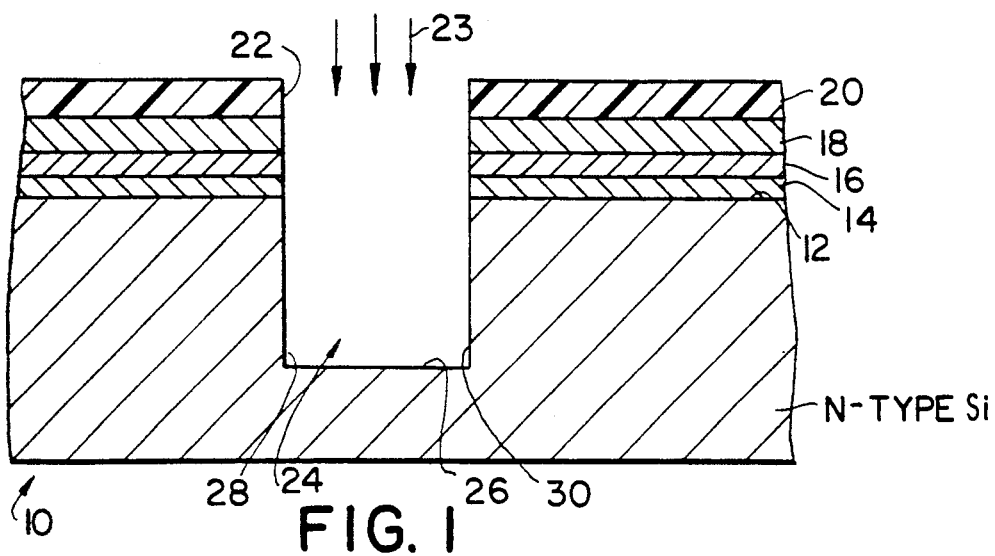
FIG. 1 is a diagrammatic illustration of the steps of coating a substrate with oxides and forming a trench in the substrate by etching.

Turning now to a more detailed description of the present invention, there is illustrated in FIG. 1 a silicon substrate 10, which in the herein-disclosed embodiment is an n-type silicon. The substrate 10 may be, for example, a buried layer forming one portion of a wafer on which a multiplicity of integrated circuits are formed. In accordance with the present process, the substrate 10 is oxidized to form on its top surface 12 a first, or initial oxide layer 14, which may be, for example, silicon dioxide about 300 Angstroms thick. Thereafter, a nitride layer 16 is applied to a thickness of about 1,000 Angstroms, followed by a layer 18 of CVD oxide 18 about 3,000 Angstroms thick. An isolating trench to be formed in the substrate 10 is then defined by forming a resist layer 20 on the oxide layer 18 and, through conventional procedures such as a photolithographic masking technique, a mask aperture 22 is formed in the resist layer. The mask aperture defines the location and length and width dimensions of the trench which is to be formed in the substrate 10, and thereafter the layers 14, 16 and 18 lyinq under the mask aperture 22 are removed, as by reactive ion etching, indicated by arrows 23. An isolating trench 24 is then etched in the substrate 10 in accordance with the dimensions and location defined by the aperture 22, in known manner. A bottom wall 26 of trench 24 is formed horizontally at a selected depth within the substrate 10, while side walls 28 and 30 of the trench extend substantially vertically downwardly from the aperture 22.

Figure 2:
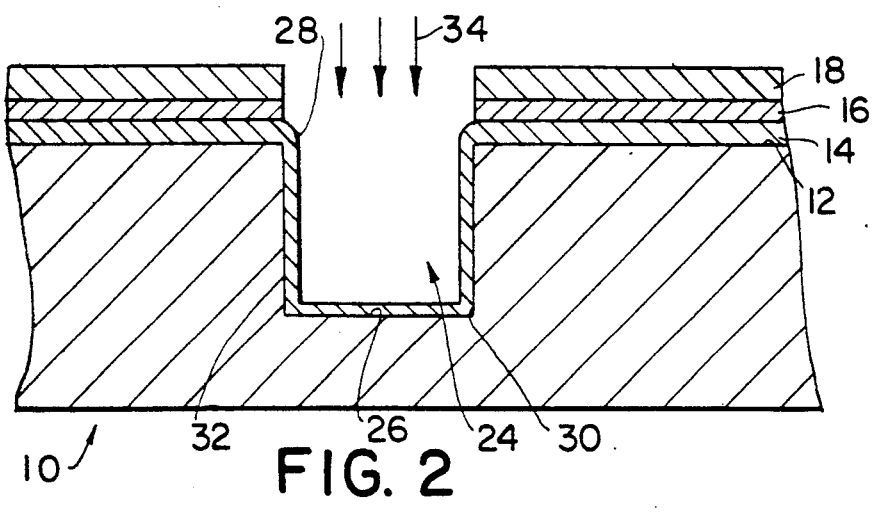
FIG. 2 is a diagrammatic illustration of the steps of forming an oxide layer on the side walls only of the trench.

After the trench 24 has been formed, the resist layer 20 is stripped from the substrate and the substrate is oxidized to form a thin layer 32 (FIG. 2) of oxide about 1,000 Angstroms thick on the side walls 28 and 30 and on the bottom wall 26 of trench 24. A second reactive ion etching step, indicated by arrows 34, is then used to remove the layer of oxide 32 from the bottom wall 26 of trench 24, leaving the oxide layer on the side walls 28 and 30.

Figure 3:
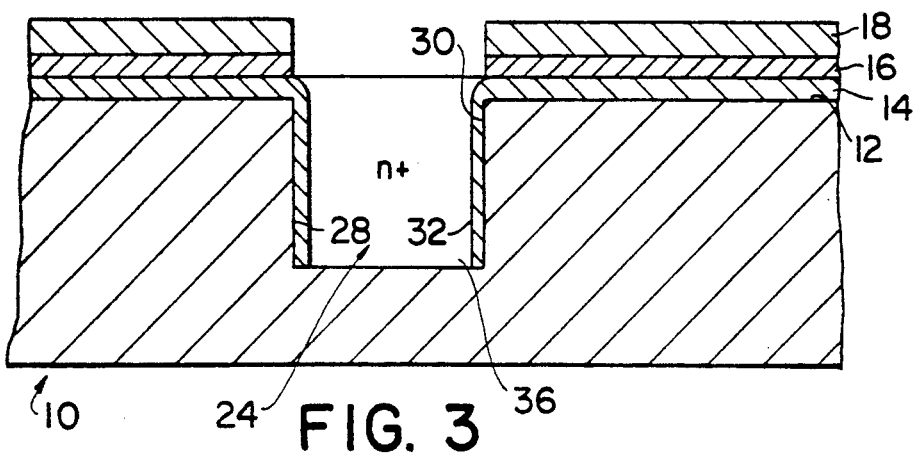
FIG. 3 is a diagrammatic illustration of the steps of depositing and planarizing n+ polysilicon material in the trench formed in accordance with FIGS. 1 and 2.

In the herein-disclosed embodiment utilizing an n-type substrate in CMOS technology, the channel 24 is then filled with an n+ polysilicon material 36, as illustrated in FIG. 3. It will be understood, however, that if a p-type substrate is used, the trench isolation process would utilize a p+ polysilicon in the trench instead of the illustrated n+ material. The polysilicon is highly doped so that it has a work function sufficiently high to neutralize the effect of the charge produced by the oxide layer 32 on the side walls 28 and 30 of trench 24.

Figure 4:
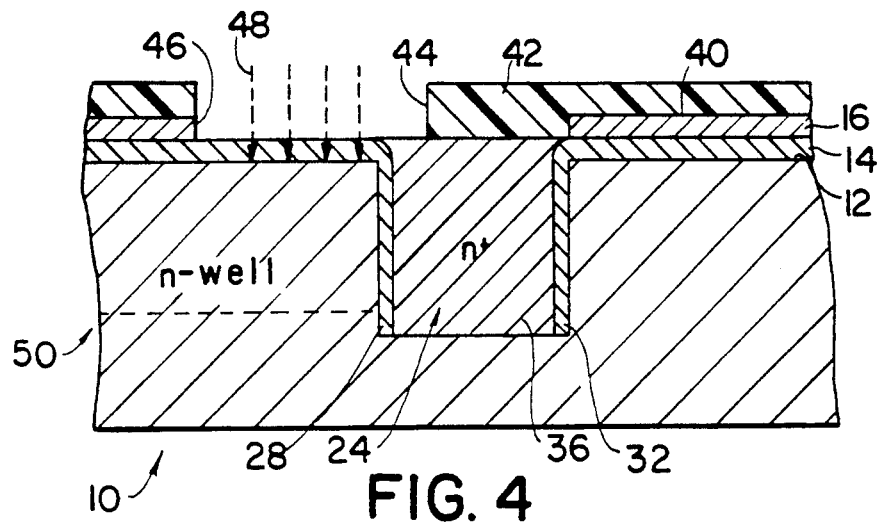
FIG. 4 is a diagrammatic illustration of the steps of defining and implanting an n-well in the substrate material of FIG. 1.

The deposited polysilicon material is then planarized at the level of the top of the oxide layer 14 (see FIG. 3) and the CVD oxide layer 18 is removed from the substrate 10 to expose the upper surface 40 illustrated in FIG. 4.

After the CVD oxide layer 18 is removed, the upper surface 40 is coated by a suitable resist material 42 and, through conventional lithographic masking techniques, an n-well mask aperture 44 is formed in the resist layer 42 to define the width and length dimensions of an n-well to be formed in the substrate 10 adjacent the well. As illustrated in FIG. 4, aperture 44 preferably extends over the top of trench 24, a short distance to insure that the n-well will be formed immediately adjacent the side wall 28 of the trench 24. The nitride layer 16 is then etched away from the substrate in the region 46 defined by the aperture 44 and a suitable n-well impurity is implanted through the thin silicon oxide layer 14 into the substrate 10, as illustrated by arrows 48. The resist layer 42 is then stripped from the substrate 10 and the substrate is annealed to drive the implanted impurities 48 into the n-well region 50 of the substrate, the n-well region being slightly less deep than the bottom of trench 24, as indicated by the n-well boundary 51. The annealing also oxidizes the exposed surfaces of the polysilicon material 36, thereby providing a thin layer 52 of oxide on the polysilicon.

Figure 5:
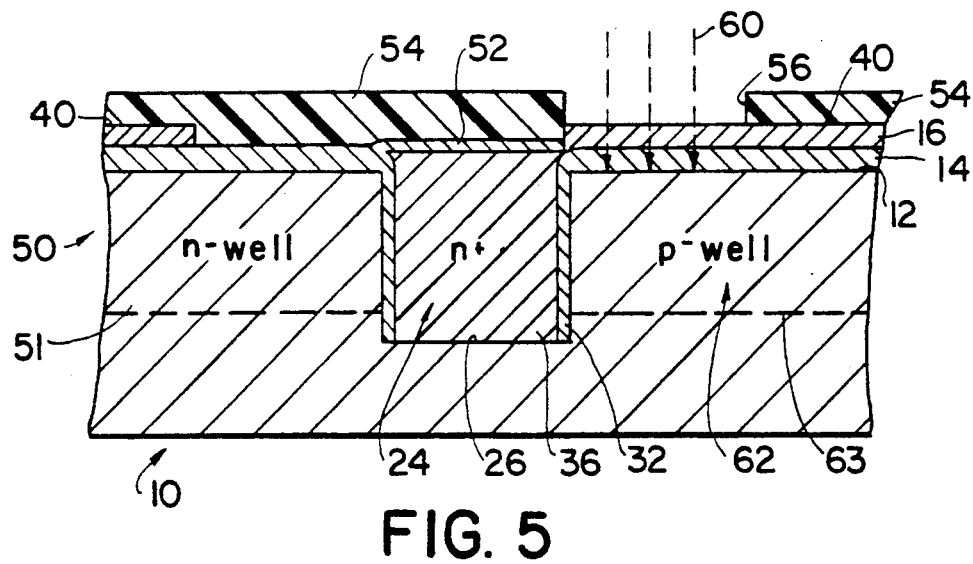
FIG. 5 is a diagrammatic illustration of the steps of implanting a p-well in the substrate of FIG. 1.

A third resist layer 54 is formed on the top surface 40 of the substrate 10 (FIG. 5) and, through conventional photolithographic techniques, a p-well mask aperture 56 defining the desired location of a p-well in the substrate is formed. Thereafter, suitable impurities, indicated by the arrows 60, are implanted through layer 14 into the substrate 10, and the substrate is annealed to drive the impurities into the substrate to form the p-well region 62 o the side of the trench 24 opposite to the location of the n-well. the p-well extends down into the substrate 10 to a level generally indicated by boundary line 63, which is shallower than the bottom of trench 24.

Figure 6:
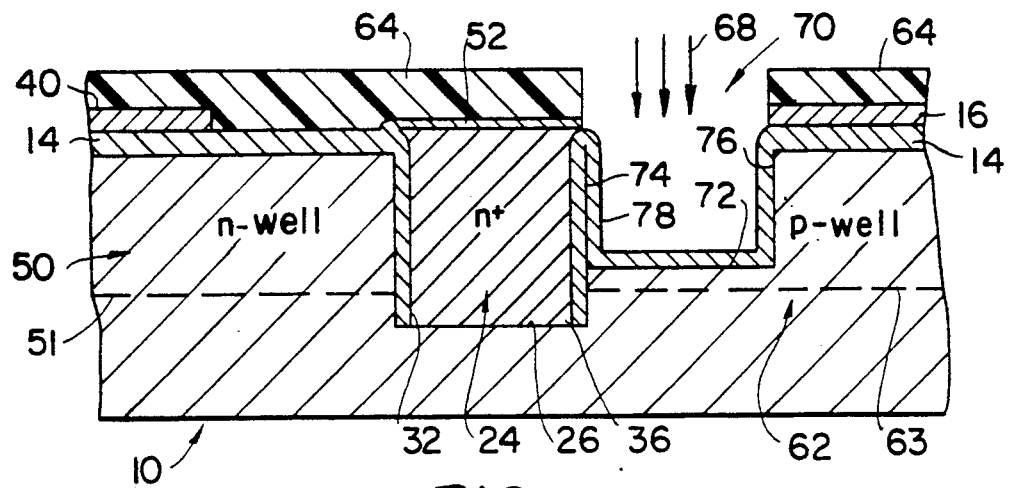
FIG. 6 is a diagrammatic illustration of the steps of forming a second, p-type trench in the p-well portion of the substrate.

After annealing the resist material 54 is removed from the substrate and a fourth resist layer 64 is formed on surface 40 (FIG. 6). A second trench mask aperture is formed in the resist layer 64 by conventional lithographic techniques to define the size, shape and location of a second isolating trench 70 to be formed in the substrate. In the illustrated embodiment, the second trench is formed immediately adjacent the first trench, so that the two will be separated only by the side wall oxide layers. However, if desired they may be spaced apart a short distance. Thereafter, the nitride and oxide layers 14 and 16 located within the aperture 66 are removed, as by reactive ion etching indicated by arrows 68, and the second isolating trench 70 is etched in the substrate 10. As illustrated in FIG. 6, the bottom wall 72 of this trench is formed at a depth shallower than the boundary 63 of the p-well 62, with the side walls 74 and 76 of the isolating trench being substantially vertical.

Figure 7:
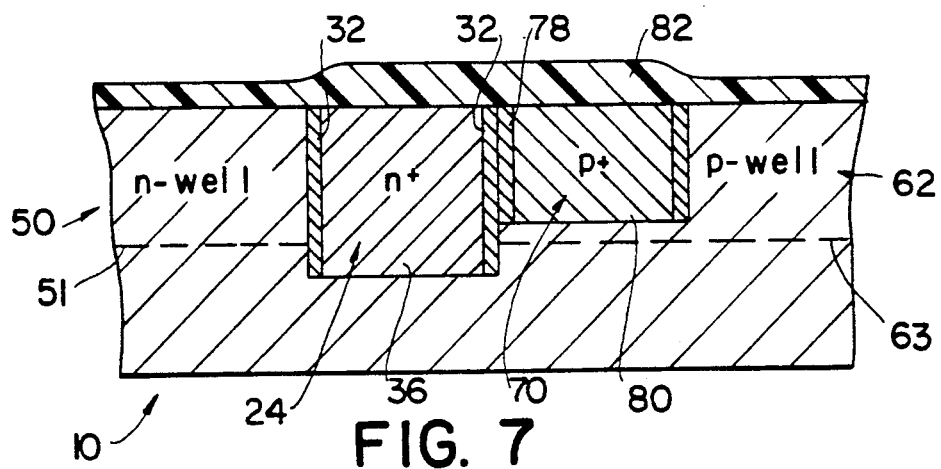
FIG. 7 illustrates the deposition of a p+ polysilicon in the second trench, the planarization of that material and the formation of a gate oxide thereon.

Upon completion of the etching of isolation trench 70, the substrate is oxidized to form an oxide layer 78 on the interior surface of the trench. The oxide layer on the bottom wall 72 is removed, as by reactive ion etching (see FIG. 7) and thereafter a p+ polysilicon material 80 is deposited in trench 70, the top surface of the polysilicon is planarized, and the resist layer 64 and the nitride and oxide layers 16 and 14, respectively, are stripped from the top surface 12 of the substrate 10, as illustrated in FIG. 7. Thereafter, a gate oxide layer 82 is grown on the top surface 12 of the substrate at low temperatures to achieve preferential oxidation rates on the heavily doped polysilicon layers formed at the top surface 12 by the isolating trenches 24 and 70, as illustrated at 76. The substrate may be further processed in conventional manner following known CMOS technology.

The oxide layers 32 and 78 on the walls of trenches 24 and 70 insulate the polysilicon materials 36 and 74 in the two trenches from each other when the trenches abut each other in the manner illustrated in FIGS. 6 and 7, and insulate the polysilicon from the surrounding n-well and p-well regions. However, the oxide material inherently has a charge which can deplete or invert the charges in the material surrounding the trenches, particularly if that surrounding material is a P-type substrate, or is a p-well. The provision of a highly doped polysilicon material in the trenches provides a material with a work function which has a similar effect on the surrounding materials as does the oxide layer, but is of opposition direction, or polarity. Accordingly, the work function of the polysilicon produces a charge which effectively neutralizes the oxide charge, preventing charge depletion and/or inversion at the trench walls, thereby enabling the oxide to function a an insulator between the n-well and the p-well. This allows the p-well and the n-well regions to be formed against the trench walls, and thus close together, without creating inversions which produce short circuits and parasitic transistor action.

The n+ trench and the p+ trench have different depths to insure that the n+ and p+ polysilicon materials don't come into contact with each other in the substrate. Alternatively, the trenches can spaced apart so that these materials don't contact each other, but such spacing reduces the density of the circuit elements formed on the substrate. The trenches are formed to a depth which enables the n+ polysilicon material 36 to contact the n-type substrate material and enables the p+ polysilicon material 80 to contact the p-well region 62.

Although the present invention has been described in terms of a preferred embodiment, it will be apparent that variations and modifications may be made without departing from the true spirit and scope thereof as set forth in the accompanying claims.

What is claimed is:

1. A method of forming isolating trenches in dual-well integrated circuits formed on an n-type silicon substrate, comprising:
   forming a first isolating trench in said substrate, said first trench having a first preselected depth;
   oxidizing the side walls of said first trench;
   filling said first trench with an n+ polysilicon material having a work function sufficient to prevent electrical conduction at the trench side walls;
   forming n-well and p-well regions in said substrate on opposite sides of said first trench, said well regions having depths in said substrate less than the depth of said first trench;
   forming a second isolating trench in said p-well region closely adjacent to said first trench, said second trench having a second preselected depth less than the depth of said p-well region; and filling said second trench with a p+ polysilicon material.

2. The method of claim 1, further including planarizing said substrate, and thereafter growing a gate oxide on the top surface of said substrate at a low temperature to achieve preferential oxidation rates on the n+ and p+ polysilicon at the top surfaces of said isolation trenches.

3. A method of forming isolating trenches in dual-well integrated circuits formed on a silicon substrate which is moderately of a first conductivity-type, comprising:

forming a first isolating trench in said substrate;
oxidizing the side walls of said first trench;
filling said first trench with a polysilicon material which is strongly of said first conductivity type and having a work function sufficient to prevent electrical conduction at the trench side walls;
forming in said substrate a first well region on one side of said first trench and a second well region on the opposite side of said first trench, said first well region being of said first conductivity-type and said second well region being of a second conductivity-type the opposite of said first conductivity-type;
forming a second isolating trench in said second well region closely adjacent to said first trench; and
filling said second trench with a polysilicon material which is strongly of said second conductivity-type.

4. The method of claim 1, wherein said first isolating trench is formed to a first preselected depth in said substrate, said well regions are formed to lesser depths in said substrate than said first depth, and said second trench is formed to a second preselected depth in said substrate which is less than the depth of said second well region.

* * * * *